(12) United States Patent
Potter et al.

(10) Patent No.: US 6,414,521 B1
(45) Date of Patent: Jul. 2, 2002

(54) SENSE AMPLIFIER SYSTEMS AND METHODS

(75) Inventors: Dale A. Potter, Beaverton; Ravindar M. Lall, Portland, both of OR (US)

(73) Assignee: Lattice Semiconductor Corp., Hillsboro, OR (US)

( * ) Notice: Subject to any disclaimer, the term of this patent is extended or adjusted under 35 U.S.C. 154(b) by 0 days.

(21) Appl. No.: 09/775,489

(22) Filed: Feb. 1, 2001

(51) Int. Cl.[7] .................................................. H03K 5/22
(52) U.S. Cl. ........................................... 327/67; 327/51
(58) Field of Search ........................ 327/52–57, 65–67, 327/87, 89, 563

(56) References Cited

U.S. PATENT DOCUMENTS 5,467,051 A * 11/1995 Abdi ........................... 327/63
6,072,239 A * 6/2000 Bertolini ...................... 327/67

* cited by examiner

Primary Examiner—Kenneth B. Wells
(74) Attorney, Agent, or Firm—Skjerven Morrill LLP

(57) ABSTRACT

A sense amplifier is provided that mitigates the effect of threshold voltage mismatch within the sense amplifier. The sense amplifier has an inverter pair coupled to the input terminals, with a resistive element coupled across output terminals of the inverter pair. Inverter gain stages following the inverter pair are coupled to a current limiting circuit to monitor and limit the current flowing through the inverter gain stage immediately following the inverter pair. The current limiting circuit allows the sense amplifier to be biased such that speed is improved while limiting power dissipation to acceptable levels, even under undesirable process, temperature, and power supply variations.

33 Claims, 3 Drawing Sheets

SENSE AMPLIFIER SYSTEMS AND METHODS

BACKGROUND OF THE INVENTION

1. Field of the Invention

The present invention relates generally to electronic circuits and, more particularly, to an improved sense amplifier.

2. Related Art

Sense amplifiers are widely used in many types of applications to detect and amplify signals. For example, sense amplifiers are used to detect signals generated by memory cells or by an array of logic gates, such as to produce the logical OR result (i.e., sum of products term) at the output terminals of a logical AND array. FIG. 3 illustrates an exemplary conventional sense amplifier 300.

One drawback of conventional sense amplifiers is their sensitivity to the semiconductor process variation referred to as threshold voltage mismatch (Vt mismatch). If the threshold voltage mismatch becomes excessive, the sense amplifier will not function properly (e.g., circuit failure) and can produce an erroneous output signal.

Another drawback of conventional sense amplifiers is the high source current that flows through the sense amplifier under certain conditions (e.g., as the source voltage increases). The high source current results in numerous problems, such as high substrate current, poor latch-up, and hot carrier injection issues for one or more components of the sense amplifier. If the sense amplifier is biased to limit this undesirable high current flow, the switching speed of the sense amplifier is degraded.

As a result, there is a need for a sense amplifier that is more tolerant to threshold voltage mismatch without requiring excessive source current or resulting in a severe degradation in speed.

BRIEF SUMMARY OF THE INVENTION

The present invention provides a sense amplifier that mitigates the affect of threshold voltage mismatch while limiting the amount of source current through the sense amplifier.

In accordance with one embodiment, a sense amplifier circuit includes input terminals and a pair of inverting buffers coupled to the input terminals and having output terminals. A resistive element is coupled between the output terminals. One or more gain stages follow the inverting buffer pair and condition and amplify the output signal on one of the output terminals to provide an output signal of the sense amplifier. A circuit is coupled to a gain stage to limit the amount of current flowing through it.

In accordance with another embodiment, a method of mitigating threshold voltage mismatch in a sense amplifier includes providing a sense amplifier having a first and a second input terminal coupled to a pair of inverting buffers providing a first and a second output terminal. The sense amplifier further includes a first amplifier coupled to the second output terminal and adapted to provide an output signal of the sense amplifier through a second amplifier. The method further includes coupling a resistive element having a first and second end across the first and second output terminal, with the first end coupled to the first output terminal and the second end coupled to the second output terminal. The method may further include coupling a circuit to the first amplifier to limit the amount of current flowing through the first amplifier.

A more complete understanding of the present invention will be afforded to those skilled in the art, as well as a realization of additional advantages thereof, by a consideration of the following detailed description of one or more embodiments. Reference will be made to the appended sheets of drawings that will first be described briefly.

Figure 1:
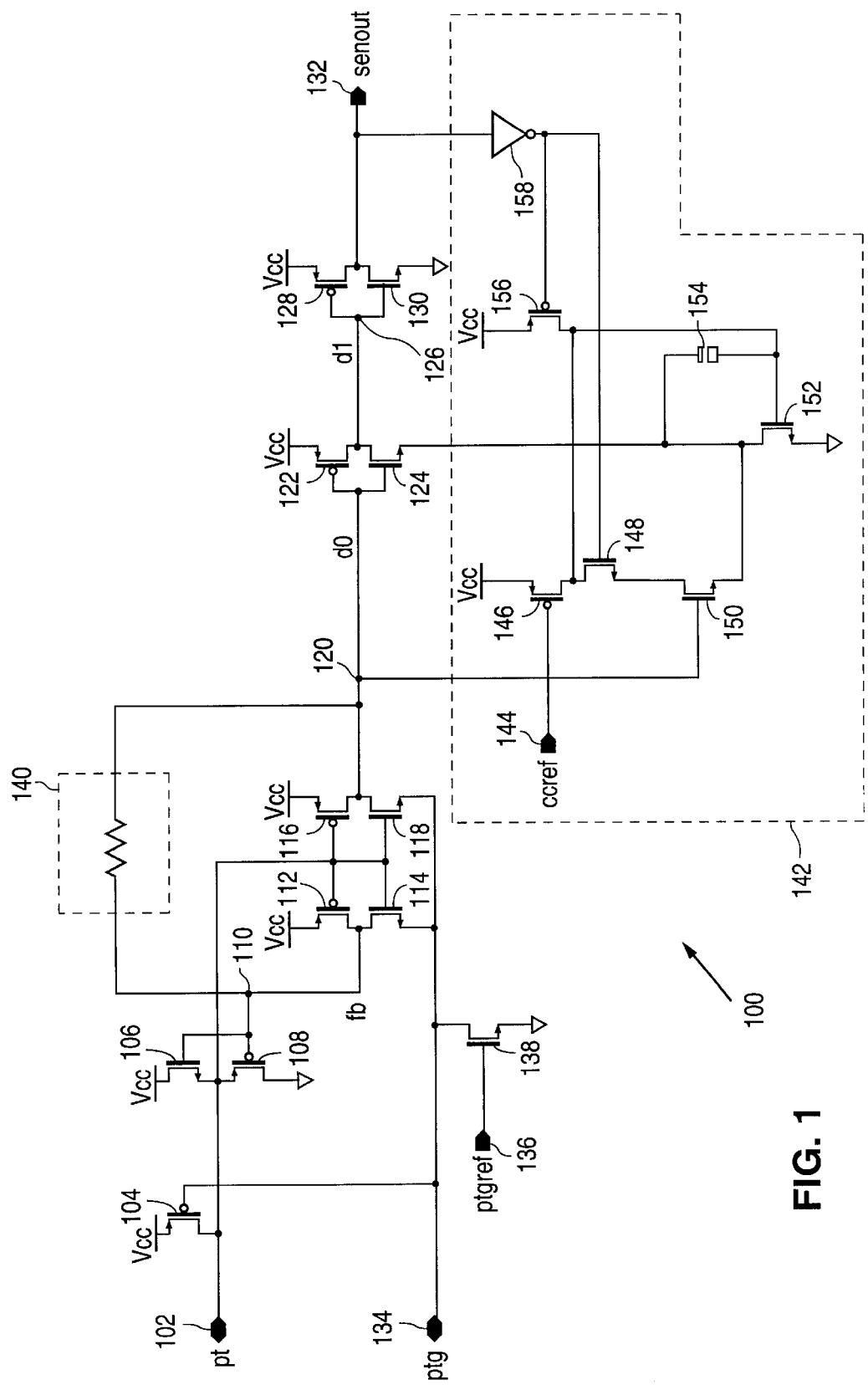
FIG. 1 is a schematic diagram illustrating a sense amplifier in accordance with an embodiment of the present invention.

The various exemplary embodiments of the present invention and their advantages are best understood by referring to the detailed description that follows. It should be understood that exemplary embodiments are described herein, but that these embodiments are not limiting and that numerous modifications and variations are possible in accordance with the principles of the present invention. In the drawings, like reference numerals are used to identify like elements illustrated in one or more of the figures.

DETAILED DESCRIPTION OF THE INVENTION

Figure 2:
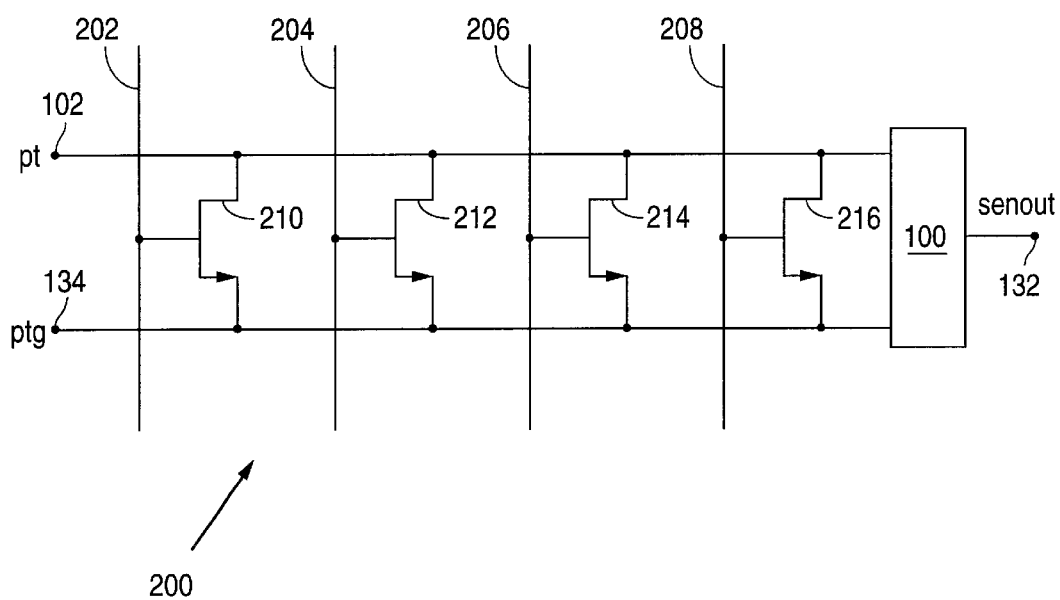
FIG. 2 is a block diagram illustrating an exemplary application of a sense amplifier in accordance with an embodiment of the present invention.
Figure 3:
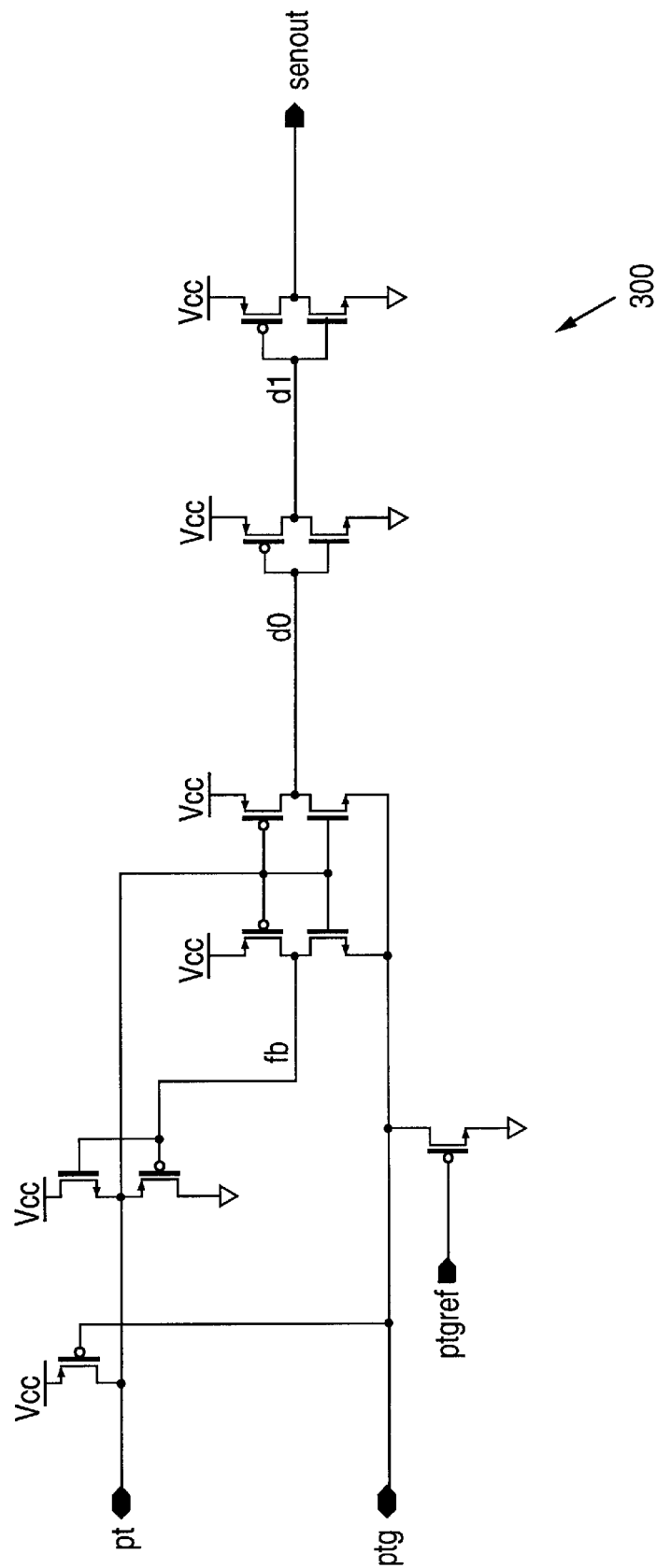
FIG. 3 is a schematic diagram illustrating a conventional sense amplifier.

FIG. 1 is a schematic diagram illustrating sense amplifier 100 in accordance with an embodiment of the present invention and FIG. 2 is a block diagram 200 illustrating an exemplary application of a sense amplifier 100 in accordance with an embodiment of the present invention. Block diagram 200 (FIG. 2) shows a number of input lines 202, 204, 206, and 208 that connect respectively to gate terminals of transistors 210, 212, 214, and 216. Input lines 202 through 208 may represent, for example, output terminals from an array of logic gates, such as an array of AND gates, or lines from input/output pins or a global routing pool. Transistors 210 through 216 function as switches to connect terminal "pt" (product term) 102 to terminal "ptg" (product term ground) 134 if a logic "high" signal level is supplied by the corresponding input line 202 through 208.

In operation, sense amplifier 100 and transistors 210–216 function as a logical OR gate by producing a logic "high" output signal at terminal 132 if one or more of input lines 202 through 208 provide a logic "high" input signal. Otherwise, a logic "low" output signal is provided at terminal 132. If terminal 102 is connected to terminal 134 by one or more of transistors 210 through 216, current will flow from terminal 102 to terminal 134, resulting in greater equalization of the voltages across terminals 102 and 134.

Referring to FIG. 1, sense amplifier 100 includes terminal 102, a terminal 134, a terminal "ptgref" (product term ground reference) 136, a terminal "ccref" (circuit current reference) 144, and a terminal "senout" (sense amplifier output) 132. Terminal 102 is coupled to gate terminals of p-type transistors 112 and 116 and n-type transistors 114 and 118. A supply voltage Vcc is coupled to source terminals of transistors 112 and 116, whose drain terminals are coupled to drain terminals of transistors 114 and 118, whose source terminals are coupled to terminal 134.

Transistors 112 and 114 function as an inverting buffer and produce an output signal at a node "fb" (feedback) 110, while transistors 116 and 118 also function as an inverting buffer and produce an output signal at a node "d0" 120. In order for sense amplifier 100 to function properly, the voltage levels at node 110 and node 120 should be approximately equal. However, due to differences in the threshold voltage between the buffer pair formed by transistors 112 and 114 and transistors 116 and 118, the voltage levels at node 110 and node 120 may differ enough to cause sense amplifier 100 to not function properly. To compensate for a potential voltage difference between the inverters at node 110 and node 120, a resistor 140 is coupled between node 110 and node 120. Resistor 140, for example, is a high resistance poly-silicon resistor that mitigates the voltage difference between node 110 and node 120 caused by threshold voltage mismatch between the inverters.

Transistors 112 and 114 provide an output signal through node 110, which is received by gate terminals of transistors 106 and 108. Transistor 106 is an n-type transistor whose drain terminal is coupled to supply voltage Vcc and whose source terminal is coupled to terminal 102 and to source terminal of transistor 108, a p-type transistor, whose drain terminal is coupled to ground. Transistors 106 and 108 receive the output signal from transistors 112 and 114 and provide a feedback signal on terminal 102 to maintain transistors 112, 114, 116, and 118 near their switch point and biased for maximum switching speed.

A p-type transistor 104 further biases sense amplifier 100 by providing a current source at terminal-102. The source terminal of transistor 104 is coupled to source voltage Vcc, while the gate terminal is coupled to terminal 134 and the drain terminal is coupled to terminal 102. An n-type transistor 138, whose gate terminal is coupled to terminal 136, drain terminal is coupled to terminal 134, and source terminal is coupled to ground, functions as a current source to limit the amount of current flowing from terminal 102 and transistors 114 and 118 to terminal 134. A reference voltage is applied to the gate terminal of transistor 138 to bias transistor 138.

Node 120 is coupled to gate terminals of a p-type transistor 122 and an n-type transistor 124, which form an inverting buffer and provide an output signal at node "d1" 126 that is coupled to the drain terminals of transistors 122 and 124. Node 126 is also coupled to the gate terminals of a p-type transistor 128and an n-type transistor 130, which form another inverting buffer and provide an output signal at terminal 132 that is coupled to the drain terminals of transistors 128 and 130. Supply voltage Vcc is coupled to the source terminals of transistors 122 and 128, with the source terminal of transistor 130 coupled to ground. Transistor 124 has its source terminal coupled to a current limiting circuit 142. Transistors 122 and 124 and transistors 128 and 130 form inverter gain stages to ultimately provide a logic "low" or logic "high" signal at terminal 132 depending upon the signal level at node 120.

Current limiting circuit 142 limits the amount of current that flows through the buffer formed by transistors 122 and 124. Current limiting circuit 142 includes p-type transistors 146 and 156, whose source terminals are coupled to supply voltage Vcc and whose drain terminals are coupled together. Terminal 144 is coupled to the gate terminal of transistor 146, while the output terminal of inverting buffer 158, whose input terminal is coupled to terminal 132, is coupled to the gate terminal of transistor 156. A reference voltage is applied to terminal 144 to bias transistor 146.

An n-type transistor 148 has its drain terminal coupled to the drain terminal of transistor 146, its gate terminal coupled to the output terminal of inverter 158, and its source terminal coupled to the drain terminal of an n-type transistor 150. Transistor 150 has its gate terminal coupled to node 120 and its source terminal coupled to the drain terminal of an n-type transistor 152 and to the source terminal of transistor 124. Transistor 152 has its source terminal coupled to ground and its gate terminal coupled to the drain terminal of transistor 156. A capacitor 154 is coupled across the drain and gate terminals of transistor 152 to assist in the switching of the inverting buffer formed by transistors 122 and 124.

In operation, sense amplifier 100 functions as a differential amplifier and detects a signal applied across terminal 102 and terminal 134 that results in current flowing from terminal 102 and/or through transistors 112–118 towards terminal 134. If the voltage across node 102 and 134 is large, sense amplifier 100 provides a logic "low" signal level at terminal 132. Otherwise, sense amplifier 100 provides a logic "high" signal level at terminal 132.

Current limiting circuit 142 monitors and limits the current flowing through the buffer formed by transistors 122 and 124 by monitoring the gate-to-source voltage (Vgs) of transistor 124. For example, when the voltage across nodes 102 and 134 is large (resulting in a logic "low" signal level at terminal 132), excessive current may begin to flow through transistor 124 due to the voltage level at node 120 increasing towards supply voltage Vcc. Because transistor 150 shares the same gate-to-source voltage as transistor 124, current limiting circuit 142 detects the increase in the amount of current flowing through transistor 124 (i.e., increasing voltage level at node 120). As the amount of current increases in transistor 124, the amount of current through transistor 150 will also increase. As this occurs, transistor 150 draws a larger current from transistor 146, which acts as a current reference device and is controlled by an input reference signal at terminal 144. Consequently, as transistor 150 draws more current than transistor 146 is biased to supply, the gate-to-source voltage of transistor 152 will then decrease, which increases the resistance of transistor 152 and limits the amount of current that is allowed to flow through transistor 124.

Current limiting circuit 142 improves the speed of sense amplifier 100 by permitting the voltage level at node 120 to be biased higher without resulting in excessive current flow through transistors 122 and 124, even during undesirable processing, temperature, or voltage conditions. The higher bias voltage improves the speed of sense amplifier 100. Current limiting circuit 142 is not required when the voltage across terminals 102 and 134 is small (resulting in a logic "high" signal level at terminal 132). Therefore, inverting buffer 158 functions to effectively turn off the current limiting function of current limiting circuit 142, while also applying supply voltage Vcc to the gate terminal of transistor 152 (by switching on transistor 156), which switches on transistor 152 to provide minimum resistance and a stable low voltage level (i.e., Vss or ground voltage level) at node 126 through transistor 124.

It should be understood that a sense amplifier in accordance with the principles of the present invention is not limited to the embodiment illustrated in FIG. 1. For example, in accordance with an embodiment of the present invention, a sense amplifier may include resistor 140, but not include current limiting circuit 142, with the source terminal of transistor 124 coupled to ground. Alternatively, a sense amplifier may include current limiting circuit 142, but not include resistor 140.

Embodiments described above illustrate but do not limit the invention. It should also be understood that numerous modifications and variations are possible in accordance with the principles of the present invention. Accordingly, the scope of the invention is defined only by the following claims.

We claim:

1. A sense amplifier circuit comprising:
   a first and a second input terminal;
   a buffer pair coupled to the first input terminal and the second input terminal, the buffer pair having a first and a second output terminal;
   an amplifier, coupled to the first input terminal and coupled to the first output terminal, and adapted to provide a feedback signal to the buffer pair;
   a resistive element coupled between the first output terminal and the second output terminal; and
   an output buffer coupled to the second output terminal to provide an output signal of the sense amplifier at a third output terminal.

2. The sense amplifier circuit of claim 1, further comprising a circuit coupled to the output buffer and adapted to limit the amount of current flowing through the output buffer.

3. The sense amplifier circuit of claim 2, wherein the circuit further comprises a third input terminal adapted to receive a reference voltage to bias the circuit.

4. The sense amplifier circuit of claim 2, wherein the circuit is further coupled to the third output terminal to receive the output signal, said output signal operates to prevent the circuit from limiting the current flowing through the output buffer.

5. The sense amplifier circuit of claim 1, further comprising:
   a first transistor coupled to the first input terminal and adapted to provide a bias current for the buffer pair; and
   a second transistor, coupled to the second input terminal, adapted to receive a reference voltage and limit the current flowing from the first input terminal and the buffer pair to the second input terminal.

6. The sense amplifier circuit of claim 3, wherein the circuit is further coupled to the second output terminal and the third output terminal and adapted to limit the amount of current flowing through the output buffer when a first voltage level is at the second output terminal and adapted to not limit the amount of current flowing through the output buffer when a second voltage level is at the second output terminal.

7. The sense amplifier circuit of claim 6, wherein the circuit minimizes its resistance to current flowing through the output buffer when the second voltage level is at the second output terminal.

8. A method of mitigating threshold voltage mismatch in a sense amplifier, the method comprising:
   providing a sense amplifier having a first and a second input terminal coupled to a pair of buffers providing a first and a second output terminal, with a first amplifier coupled to the second output terminal and adapted to provide an output signal of the sense amplifier through a second amplifier;
   coupling a third amplifier to the first input terminal and to the first output terminal to provide a feedback signal to the pair of buffers; and
   coupling a resistive element having a first and second end across the first and second output terminal, with the first end coupled to the first output terminal and the second end coupled to the second output terminal.

9. The method of claim 8, further comprising coupling a circuit to the first amplifier to limit the amount of current flowing through the first amplifier.

10. The method of claim 9, wherein the circuit limits the amount of current flowing through the first amplifier for a first voltage level at the second output terminal and does not limit the amount of current flowing through the first amplifier for a second voltage level at the second output terminal.

11. The method of claim 10, wherein the circuit minimizes its resistance to current flowing through the first amplifier when the second voltage level is at the second output terminal.

12. The method of claim 8, further comprising coupling a first transistor to the first input terminal and a second transistor to the second input terminal to bias the pair of buffers and limit the amount of current flowing towards the second input terminal.

13. A logic gate array comprising:
   a plurality of logic gates having output terminals; and
   at least one sense amplifier coupled to one or more of the output terminals, each of the sense amplifiers comprising:
      a first and a second input terminal;
      a first and a second amplifier coupled to the first input terminal and the second input terminal, the first amplifier having a first output terminal and the second amplifier having a second output terminal;
      a third amplifier coupled to the second output terminal and having a third output terminal; and
      a fourth amplifier coupled to the third output terminal and having a fourth output terminal to provide an output signal of the sense amplifier.

14. The logic gate array of claim 13, wherein the first, second, third, and fourth amplifiers are inverters.

15. The logic gate array of claim 13, further comprising a circuit coupled to the third and fourth amplifier and adapted to limit the amount of current flowing through the third amplifier.

16. The logic gate array of claim 13, further comprising a fifth amplifier, coupled to the first input terminal and coupled to the first output terminal, and adapted to provide a feedback signal to the first and second amplifier.

17. The logic gate array of claim 13, further comprising:
   a first transistor coupled to the first input terminal and adapted to provide a bias current for the first and second amplifier; and
   a second transistor, coupled to the second input terminal, and adapted to receive a reference voltage and limit the current flowing through the second input terminal.

18. The logic gate array of claim 15, further comprising a resistive element coupled between the first output terminal and the second output terminal and wherein the circuit limits the amount of current flowing through the third amplifier for a first voltage level at the second output terminal and minimizes its resistance to current flowing through the third amplifier for a second voltage level at the second output terminal.

19. The logic gate array of claim 15, wherein the circuit limits the amount of current flowing through the third amplifier for a first voltage level at the second output terminal and does not limit the amount of current flowing through the third amplifier for a second voltage level at the second output terminal.

20. The logic gate array of claim 19, wherein the circuit minimizes its resistance to current flowing through the third amplifier when the second voltage level is at the second output terminal.

21. A sense amplifier comprising:
   a first and second input terminal;
   a first and second inverter coupled to the first and second input terminal and having a first and second output terminal;

a resistor coupled across the first and second output terminals;

a third inverter coupled to the second output terminal and having a third output terminal;

a fourth inverter coupled to the third output terminal and having a fourth output terminal to provide an output signal of the sense amplifier; and a circuit coupled to the third and fourth inverter and adapted to limit the current flowing through the third inverter.

22. The sense amplifier of claim 21, further comprising an amplifier, coupled to the first input terminal and coupled to the first output terminal, and adapted to provide a feedback signal to the first and second inverter.

23. The sense amplifier of claim 21, further comprising:

a first transistor coupled to the first input terminal and adapted to provide a bias current for the first and second inverter; and a second transistor, coupled to the second input terminal, and adapted to receive a reference voltage and limit the current flowing through the second input terminal.

24. The sense amplifier of claim 21, wherein the circuit limits the amount of current flowing through the third inverter for a first voltage level at the second output terminal and does not limit the amount of current flowing through the third inverter for a second voltage level at the second output terminal.

25. The sense amplifier of claim 24, wherein the circuit minimizes its resistance to current flowing through the third inverter when the second voltage level is at the second output terminal.

26. A sense amplifier comprising:

a first and a second input terminal;

an output terminal;

a pair of CMOS inverters each having a gate terminal, a source terminal, and an output node, the gate terminals coupled together and to the first input terminal and the source terminals coupled to the second input terminal;

a resistor coupled between the inverter output nodes; and an output buffer coupled between the CMOS inverters and the output terminal.

27. The sense amplifier of claim 26, wherein the resistor is coupled directly to the inverter output nodes.

28. The sense amplifier of claim 26, further comprising an amplifier coupled between the first input terminal and an inverter output node, the amplifier responsive to an output signal from the output node and adapted to provide a feedback signal to the first input terminal.

29. The sense amplifier of claim 26, further comprising a current-limiting circuit coupled to the output buffer and adapted to limit the amount of current flowing through the output buffer.

30. A sense amplifier comprising:

a first and a second input terminal;

an output terminal;

a pair of CMOS inverters each having a gate terminal, a source terminal, and an output node, the gate terminals coupled together and to the first input terminal and the source terminals coupled to the second input terminal;

an output buffer coupled between the CMOS inverters and the output terminal; and a current-limiting circuit coupled to the output buffer and adapted to limit the amount of current flowing through the output buffer.

31. The sense amplifier of claim 30, further comprising an amplifier coupled between the first input terminal and an inverter output node, the amplifier responsive to an output signal from the output node and adapted to provide a feedback signal on the first input terminal.

32. A sense amplifier comprising:

a first and a second input terminal;

an output terminal;

a buffer pair coupled to the first input terminal and the second input terminal;

an output buffer coupled between the buffer pair and the output terminal, the output buffer including a first transistor having a gate terminal and a source terminal; and a current-limiting circuit coupled to the output buffer and adapted to limit the amount of current flowing through the first transistor, the current-limiting circuit including a second transistor coupled to the source terminal of the first transistor and configured to change resistance in response to a change in the gate-to-source voltage of the first transistor.

33. The sense amplifier of claim 32, wherein the current-limiting circuit further comprises an inverter coupled to the output terminal that turns off the current-limiting function when the output terminal is at one logic level and turns on the current-limiting function when the output terminal is at another logic level.

* * * * *